US008673075B2

(12) United States Patent
Orschel et al.

(10) Patent No.: US 8,673,075 B2
(45) Date of Patent: Mar. 18, 2014

(54) PROCEDURE FOR IN-SITU DETERMINATION OF THERMAL GRADIENTS AT THE CRYSTAL GROWTH FRONT

(75) Inventors: Benno Orschel, Salem, OR (US); Andrzej Buczkowski, Bend, OR (US); Joel Kearns, Springfield, VA (US); Keiichi Takanashi, Saga (JP); Volker Todt, Lake Oswego, OR (US)

(73) Assignees: Sumco Phoenix Corporation, Phoenix, AZ (US); Sumco Corporation, Tokyo (JP)

( * ) Notice: Subject to any disclaimer, the term of this patent is extended or adjusted under 35 U.S.C. 154(b) by 0 days.

(21) Appl. No.: 13/434,167

(22) Filed: Mar. 29, 2012

(65) Prior Publication Data

US 2012/0186512 A1    Jul. 26, 2012

Related U.S. Application Data (62) Division of application No. 12/221,229, filed on Jul. 31, 2008.

(51) Int. Cl.
*C30B 15/22*    (2006.01)

(52) U.S. Cl.
USPC ............. 117/208; 117/13; 117/14; 117/15; 117/206; 117/209; 117/210; 117/211; 117/212; 117/213; 117/214; 117/215; 117/216; 117/217; 117/218

(58) Field of Classification Search
CPC ........ C30B 15/00; C30B 15/14; C30B 15/20; C30B 15/203; C30B 15/206

USPC ............. 117/13–15, 18–83, 206, 208–218, 117/931–932

See application file for complete search history.

(56) References Cited

U.S. PATENT DOCUMENTS

| 3,929,557 | A  |   | 12/1975 | Goodrum |
|---|---|---|---|---|
| 5,408,952 | A  |   | 4/1995  | Wakabayashi et al. |
| 5,653,799 | A  |   | 8/1997  | Fuerhoff |
| 5,656,078 | A  |   | 8/1997  | Fuerhoff |
| 5,882,402 | A  | * | 3/1999  | Fuerhoff ...................... 117/201 |
| 5,993,902 | A  |   | 11/1999 | Heid |
| 6,171,391 | B1 |   | 1/2001  | Fuerhoff et al. |
| 6,203,611 | B1 |   | 3/2001  | Kimbel et al. |
| 6,241,818 | B1 |   | 6/2001  | Kimbel et al. |
| 6,726,764 | B2 | * | 4/2004  | Mutti et al. ...................... 117/14 |

(Continued)

FOREIGN PATENT DOCUMENTS

| EP | 1 171 652 B1 |   | 1/2003 |
|---|---|---|---|
| JP | 62-083395 |   | 4/1987 |
| JP | 2005097049 A | * | 4/2005 |
| WO | WO00/22201 |   | 4/2000 |

*Primary Examiner* — Michael Kornakov
*Assistant Examiner* — Kenneth A Bratland, Jr.
(74) *Attorney, Agent, or Firm* — Brinks Gilson & Lione (57) ABSTRACT

A method and apparatus for growing a semiconductor crystal include pulling the semiconductor crystal from melt at a pull speed and modulating the pull speed by combining a periodic pull speed with an average speed. The modulation of the pull speed allows in-situ determination of characteristic temperature gradients in the melt and in the crystal during crystal formation. The temperature gradients may be used to control relevant process parameters that affect morphological stability or intrinsic material properties in the finished crystal such as for instance the target pull speed of the crystal or the melt gap, which determines the thermal gradient in the crystal during growth.

19 Claims, 3 Drawing Sheets

(56) References Cited

U.S. PATENT DOCUMENTS

| | | |
|---|---|---|
| 6,776,840 B1 | 8/2004 | Fuerhoff et al. |
| 6,899,758 B2 | 5/2005 | Abe et al. |
| 6,994,748 B2 * | 2/2006 | Moriya et al. ............ 117/14 |
| 2002/0029738 A1 * | 3/2002 | Takanashi et al. ............ 117/217 |
| 2005/0016443 A1 | 1/2005 | Lu et al. |
| 2006/0137599 A1 | 6/2006 | Cho |
| 2007/0017433 A1 | 1/2007 | Sakurada et al. |

* cited by examiner

PROCEDURE FOR IN-SITU DETERMINATION OF THERMAL GRADIENTS AT THE CRYSTAL GROWTH FRONT

CROSS REFERENCE TO RELATED APPLICATIONS

The present application is a division of U.S. application Ser. No. 12/221,229, filed Jul. 31, 2008, pending, which is incorporated herein in its entirety by this reference.

BACKGROUND

The present invention relates generally to growth of semiconductor crystals. More particularly, the present invention relates to a procedure for in-situ determination of thermal gradients at the crystal growth front in a semiconductor crystal.

Most processes for fabricating semiconductor electronic components are based on single crystal silicon. Conventionally, the Czochralski process is implemented by a crystal pulling machine to produce an ingot of single crystal silicon. The Czochralski or CZ process involves melting highly pure silicon or polycrystalline silicon in a crucible located in a specifically designed furnace contained in part by a heat shield. The crucible is typically made of quartz or other suitable material. After the silicon in the crucible is melted, a crystal lifting mechanism lowers a seed crystal into contact with the silicon melt. The mechanism then withdraws the seed to pull a growing crystal from the silicon melt. The crystal is substantially free of defects and therefore suitable for manufacturing modern semiconductor devices such as integrated circuits. While silicon is the exemplary material in this discussion, other semiconductors such as gallium arsenide, indium phosphide, etc. may be processed in similar manner, making allowances for particular features of each material.

A key manufacturing parameter is the diameter of the ingot pulled from the melt. After formation of a crystal neck or narrow-diameter portion, the conventional CZ process enlarges the diameter of the growing crystal. This is done under automatic process control by decreasing the pulling rate or the temperature of the melt in order to maintain a desired diameter. The position of the crucible is adjusted to keep the melt level constant relative to the crystal. By controlling the pull rate, the melt temperature, and the decreasing melt level, the main body of the crystal ingot grows with an approximately constant diameter. During the growth process, the crucible rotates the melt in one direction and the crystal lifting mechanism rotates its pulling cable or shaft along with the seed and the crystal in an opposite direction.

Conventionally, the Czochralski process is controlled in part as a function of the diameter of the crystal during pulling and the level of molten silicon in the crucible. Process goals are a substantially uniform crystal diameter and minimized crystal defects. Crystal diameter has been controlled by controlling the melt temperature and the pull speed.

It has been found that temperature gradient at the crystal growth front (i.e., the crystal-melt interface) is also a valuable measure of process performance. Temperature gradients are important crystal growing process parameters that affect crystal diameter control, crystal morphological stability in heavily doped crystal growing, and bulk crystal micro-defects. Conventionally, nominal temperature gradients are pre-determined by hot-zone design, which is done with the help of computer assisted design (CAD) software. Later in praxis, the actual gradients, without really knowing precise values, are then adjusted (e.g. by making small changes to the melt-heat-shield-gap) according to post pull material analysis, for instance by analyzing the distribution of interstitial and vacancy defects. Such adjustments are done on a run-by run basis and a number of high quality CZ-materials with tight material properties specifications require permanent monitoring and adjustment. The permanent monitoring is necessary because material properties of the hot-zone parts that determine the thermal gradients change over time due to repeated use. However, such run-to-run analysis is unable to fine-adjust gradual changes that occur during a run and, worse, it is unable to catch and correct during a run gradient deviations due to pre-run set-up-errors such as a wrong melt-heat-reflector gap, etc., that sometimes occur due to human error. What is needed is a reliable method and apparatus for determining thermal gradients at the crystal growth front during crystal growth and for controlling the crystal growth process using this information.

BRIEF SUMMARY

By way of introduction, the present embodiments provide a method and apparatus for growing a semiconductor crystal which include pulling the semiconductor crystal from melt at a pull speed and modulating the pull speed by combining a periodic pull speed with an average speed. The modulation of the pull speed allows real-time determination of temperature gradients in the melt and in the crystal during crystal formation. The gradients can be used to make adjustments to make in-situ corrections to relevant process parameters that affect gradient dependent intrinsic crystal properties.

In an embodiment, the normal crystal pull speed, which includes the target pull speed plus a corrective term coming from the diameter control system, is superimposed by a periodic term of predetermined amplitude and frequency. This will induce a small periodic modulation of the otherwise normal diameter. In order to work unaffected by the small superimposed signal, the diameter control system receives a filtered signal that does not contain the modulation frequency. However, the new temperature gradient estimation uses a frequency selective algorithm to filter out the amplitude and phase shift of the superimposed diameter modulation. This information, together with the predetermined pull-speed modulation amplitude, is then used by an algorithm that calculates the temperature gradients. The results of this calculation can further be used to compare these values to target values and make adjustments to relevant system parameters that affect gradient-dependent intrinsic properties while the crystal is growing. In the preferred embodiment, adjustments to the melt gap are made in order to achieve the desired crystal temperature gradient.

The foregoing discussion of the preferred embodiments has been provided only by way of introduction. Nothing in this section should be taken as a limitation on the following claims, which define the scope of the invention.

DETAILED DESCRIPTION OF THE DRAWINGS AND THE PRESENTLY PREFERRED EMBODIMENTS

Figure 1:
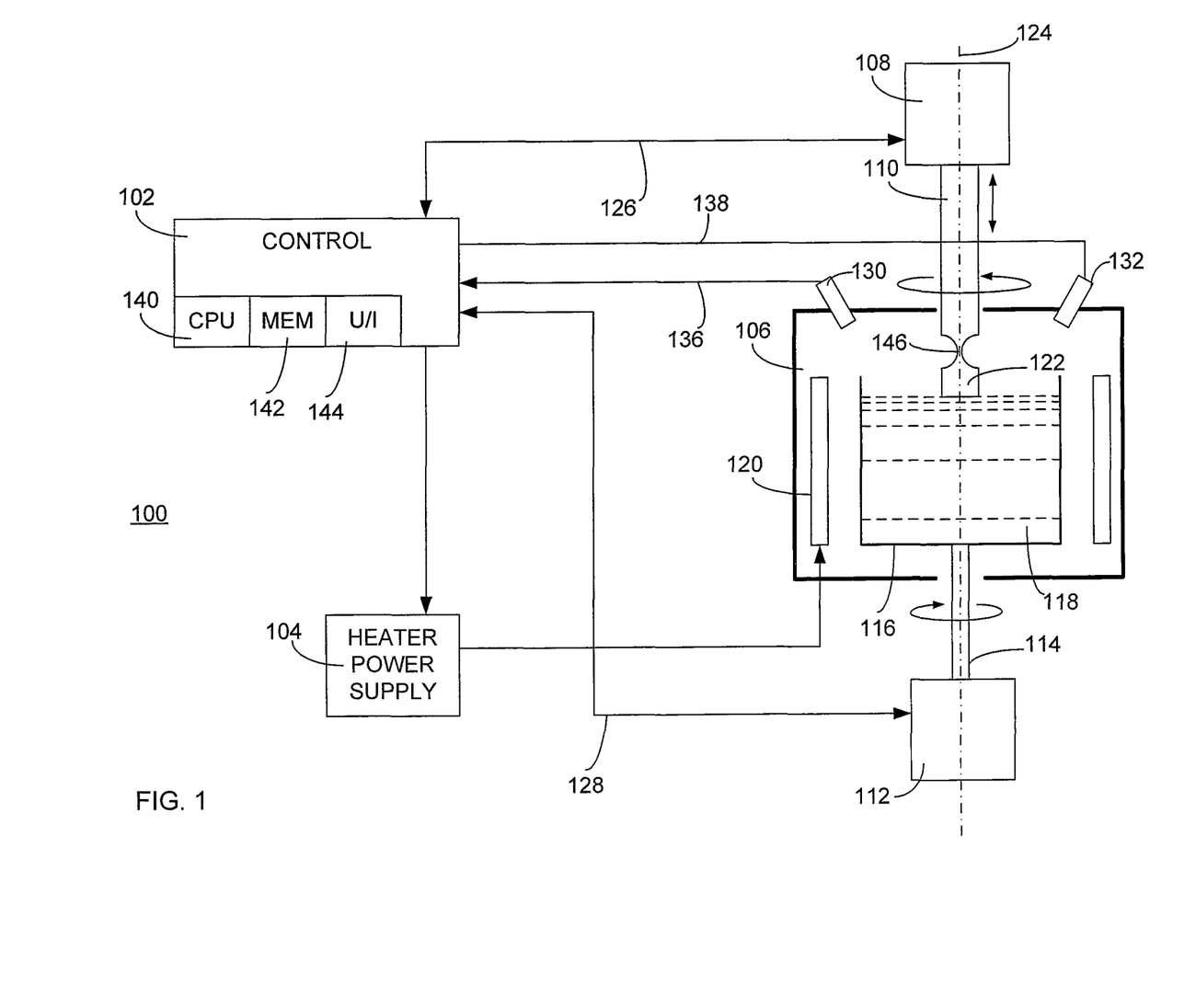
FIG. 1 is a block diagram of an exemplary semiconductor crystal growth apparatus.

Referring now to the drawing, FIG. 1 is a block diagram of an exemplary semiconductor crystal growth apparatus 100. The apparatus 100 includes a control unit 102, a heater power supply 104 and a crystal growth chamber 106. The apparatus 100 further includes a crystal pull unit 108, a crystal shaft 110, a crucible drive unit 112 and a crucible drive shaft 114.

Contained within the chamber 106 is a crucible 116 containing melt 118 and a heater 120. In the illustration of FIG. 1, a semiconductor crystal 122 is formed from the melt 118. The control unit 102 is coupled with the heater power supply 104 to control the heater power supply 104. By controlling the heater power supply 104, the temperature of the melt 118 is controlled to permit controlled growth of the semiconductor crystal 122.

The crystal pull unit 108 operates to pull the crystal shaft 110 along the center axis 124. The crystal pull unit 108 also operates to rotate the crystal shaft 110 about the center axis 124. In FIG. 1, counterclockwise rotation is indicated, but clockwise rotation may be substituted and both may be available by appropriate control of the crystal pull unit 108. Rotation or movement of the crystal pull shaft 110 causes like rotation or movement of the crystal 122. The crystal pull unit 108 includes one or more electric motors or other devices for pulling and rotating the crystal shaft 110. The crystal pull unit 108 is controlled by signals proved over a control line 126 from the control unit 102.

Similarly, the crucible drive unit 112 operates to move the crucible drive shaft 114 along the center axis 124 and to rotate the crucible drive shaft 114 about the center axis 124. In FIG. 1, clockwise rotation is indicated, but counterclockwise rotation may be substituted and both may be available by appropriate control of the crucible drive unit 112. Rotation or movement of the crucible drive shaft 114 causes like rotation or movement of the crucible 116. The crucible drive unit 112 includes one or more electric motors or other devices for pulling and rotating the crucible drive shaft 114. The crucible drive unit 112 is controlled by signals proved over a control line 128 from the control unit 102.

The crystal 122 is formed from the melt 118 within the crucible 116. Because of surface tension, the crystallization front, which is the phase interface between solid and liquid semiconductor material in the crucible 116, is raised a bit above the melt level. The liquid semiconductor does not wet the crystal completely. In fact it contacts the solid crystal at a certain angle $\Theta_0$. This is referred to as the contact-, wetting-, or meniscus-equilibrium angle.

The area of the melt below the crystal which is raised above the melt level is called meniscus. The position of the crystallization front raised above the melt is important to the properties of the growth process. If it is raised too far above the melt, the crystal radius decreases; otherwise it increases.

For monitoring the crystal growth process, the chamber 106 includes one or more sensors. In the illustrated embodiment of FIG. 1, these include a camera 130 and a temperature sensor 132. The camera 130 is mounted near a viewing port of the chamber and directed to view the surface of the melt 118. The camera 130 produces signals indicative of a camera image on a control line 136 and provides the signals to the control unit 102. Conventional technologies provide crystal diameter measurements. These include methods of measuring the width of the bright ring, which is a characteristic of the reflection of the crucible wall in the meniscus which is formed at the solid-liquid interface between the crystal 122 and the melt 118. Conventional bright ring and meniscus sensors employ devices such as optical pyrometers, photocells, rotating mirrors with photocells, light sources with photocells, line-scan cameras and two-dimensional array cameras. Other optical measurement devices may be used instead or as well. The temperature sensor 132 detects temperature in the chamber 106 and provides data indicative of the temperature to the control unit 102 on a control line 138. The apparatus 100 may also include a crystal diameter sensor configured to measure diameter of the crystal 122. The crystal diameter sensor may be of any conventional type.

The control unit 102 in the illustrated embodiment generally includes a central processing unit (CPU) 140, a memory 142 and a user interface 144. The CPU 140 may be any suitable processing device such as a microprocessor, digital signal processor, digital logic function or a computer. The CPU 140 operates according to data and instructions stored in memory 142. Further, the CPU 140 operates using data and other information received from sensor such as over control lines 126, 128, 136, 138. Still further, the CPU 140 operates to generate control signals to control portions of the semiconductor crystal growth apparatus 100 such as the heater power supply 104, the crystal pull unit 108 and the crucible drive unit 112.

The memory 142 may be any type of dynamic or persistent memory such as semiconductor memory, magnetic or optical disk or any combination of these or other storage. In some applications, the present invention may be embodied as a computer readable storage medium containing data to cause the CPU 140 to perform certain specified functions in conjunction with other components of the semiconductor crystal growth apparatus 100.

The user interface 144 permits user control and monitoring of the semiconductor crystal growth apparatus 100. The user interface 144 may include any suitable display for providing operational information to a user and may include any sort of keyboard or switches to permit user control and actuation of the semiconductor crystal growth apparatus 100.

The semiconductor crystal growth apparatus 100 enables growth of a single crystal semiconductor ingot according to the Czochralski process. According to this process, semiconductor material such as silicon is placed in the crucible 116. The heater power supply 104 actuates the heater 120 to heat the silicon and cause it to melt. The heater 120 maintains the silicon melt 118 in a liquid state. According to the conventional process, a seed crystal 146 is attached to the crystal pull shaft 110. The seed crystal 146 is lowered into the melt 118 by the crystal pull unit 108. Further, the crystal pull unit 108 causes the crystal pull shaft 110 and the seed crystal 146 to rotate in a first direction, such as counterclockwise, while the crucible drive unit 112 causes the crucible drive shaft 114 and the crucible 116 to rotate in the opposite direction, such as clockwise. The crucible drive unit 112 may also raise or lower the crucible 116 as required during the crystal growth process. For example, the melt 118 depletes as the crystal is grown, so the crucible drive unit is raised to compensate and keep the melt level substantially constant. During this process, the heater power supply 104, the crystal pull unit 108 and the crucible drive unit 112 all operate under control of the control unit 102.

The control unit 102 further operates to control the semiconductor crystal growth apparatus 100 during growth of a crystal 122. This includes controlling the pull speed of the crystal pull unit 108 and the speed of movement of the crucible 116 under control of the crucible drive unit 112. In accordance with the present embodiments, the crystal pull unit 108 pulls the crystal 122 at an average pull speed plus a periodic pull speed variation which is superimposed on the average pull speed.

The average pull speed is represented by the variable $v_0$, which itself is composed of a target pull speed $\overline{v}$ plus a corrective term $\Delta v$ that is generated by the diameter control system. The average crystal growth rate is represented by the variable $v_g$. For simplification it is assumed in the following discussion that the level of the melt 118 is kept at a substantially constant level, so that the average pull speed v equals the average growth rate $v_g$. Only temporary deviations between v and $v_g$ due to transitional changes in meniscus height are to be considered.

As noted, the average speed at which the crystal is pulled from the melt is deliberately superimposed with a periodic variation in the form $$v = v_0 + \delta v \cdot \sin(\omega \cdot t) \quad (1.0)$$

where $v_0$ is the normal pull speed, consisting of target pull speed plus a corrective term coming from the diameter control system, $\delta v$ is the amplitude and $\omega$, is the angular frequency of modulation of the pull speed. The diameter of the crystal is related to the pull speed. The modulation induced rate at which the crystal diameter is changing is given by $$v_r = v_g \tan(\Theta_S) \quad (2.0)$$

where $\Theta_s$ is defined as the offset angle from the meniscus wetting angle $\Theta_0$, at which the crystal radius is not changing and $v_c$ is the crystallization velocity. This will impose a periodic change in radius change $v_r$ and radius r $$v_r = v_{r0} + \delta v_r \cdot \sin(\omega \cdot t + \phi) \quad (3.0)$$

$$r = r_0 + \delta r \cdot \cos(\omega \cdot t + \phi) \quad (3.1)$$

$$\delta r = \frac{\delta v_r}{\omega} \quad (3.2)$$

where $\phi$ represents a phase shift that may be caused by a retardation of $v_g$ in following the pull speed variation.

Since $\delta r$ is measured during crystal growth, one can also determine $\delta v_r$, which is connected with $v_g$ over the total derivative of equation 2.0.

$$\delta v_r = \tan(\Theta_S) \cdot \delta v_g + v_g \cdot \sec(\Theta_S)^2 \cdot \delta \Theta_S \quad (4.0)$$

Since the average growth rate $v_g$ has to be equal to the average pull speed v, $\Theta_S$ then is determined by equation 2.0 with $v_g = v$. If $\omega$ is not too high one can assume $\delta v_g = \delta v$, so that with the measured $\delta v_r$, $\delta \Theta_S$ can be obtained by equation 4.0.

The heat transfer balance at the crystal growth front (crystal-melt interface) is described by a one dimensional approximation as $$L \cdot v_g = \kappa_S \cdot G_S - \kappa_L \cdot G_L \quad (5.0)$$

where $\kappa_S$ and $\kappa_L$ are the thermal conductivities and $G_S$ and $G_L$ are the temperature gradients of solid and liquid respectively. L is the latent heat per unit volume of crystal and $v_g$ is the crystal growth rate.

A simplified expression for $G_L$ can be given by $$G_L = \frac{\Delta T_B}{h} \quad (5.1)$$

where h is the meniscus height and $\Delta T_B$ is the temperature difference between meniscus base and crystal melt interface.

Alternate expressions for $G_L$ can be developed for specific crystal growth conditions. Substituting from equation 5.1, equation 5.0 becomes $$L \cdot v_g = \kappa_S \cdot G_S - \kappa_L \cdot \frac{\Delta T_B}{h} \quad (6.0)$$

Changes in growth rate $v_c$ over an extended time period will have an effect on h, $\Delta T_B$ and $G_S$. However, small periodic changes in growth rate $v_g$ as imposed by the pull speed modulation (equation 1.0) mainly will affect h and leave $\Delta T_B$, and $G_S$ unchanged. The differential of equation 6.0 then becomes $$L \cdot \delta v_g = \kappa_L \cdot \frac{\Delta T_B}{h^2} \cdot \delta h \quad (7.0)$$

$$L \cdot \delta v_g = \kappa_L \cdot G_L \cdot \frac{\delta h}{h} \quad (7.1)$$

Equation 7.1 provides a link between the growth rate variation $\delta v_g$ and the relative variation in meniscus height $$\frac{\delta h}{h}.$$

Changes in meniscus height however, are connected to a change in wetting angle. Substitution of $$\frac{\delta h}{h}$$

in equation 7.1 by an expression of $\delta \Theta_S$ provides a way of determining a characteristic $G_L$ and, with equation 6.0, $G_S$. To do so, for now a simple model is deployed.

Figure 2:
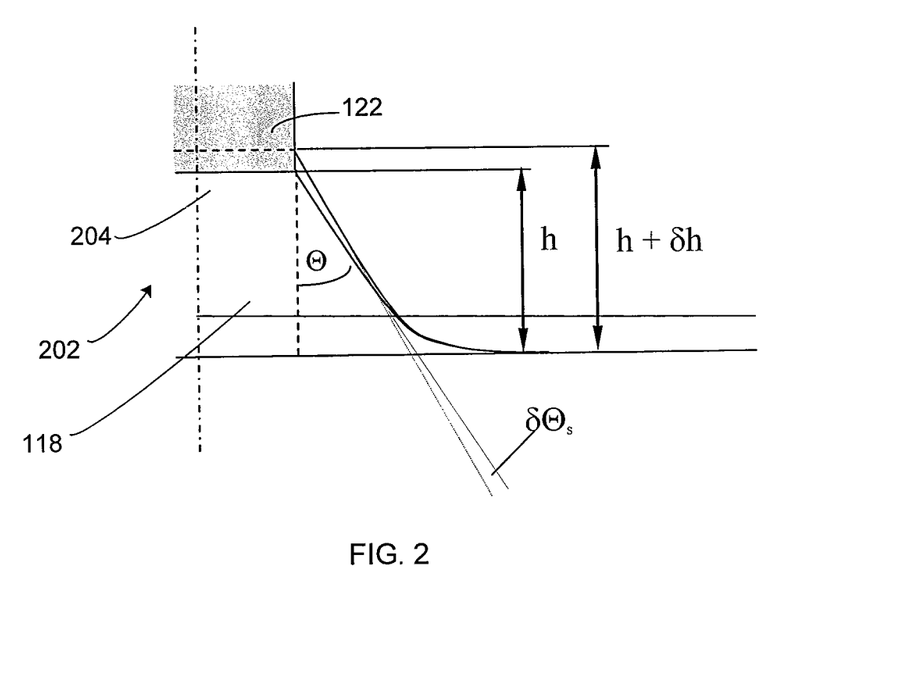
FIG. 2. illustrates an analytical model relating changes in wetting angle and meniscus height in a semiconductor crystal manufactured in the apparatus of FIG. 1.

FIG. 2. illustrates a model relating changes in wetting angle $\Theta_S$ and meniscus height h. In FIG. 2, a meniscus 202 is shown formed at a crystallization front 204 between a crystal 122 and melt 118. A small change in meniscus height $\delta h$ is assumed to leave the length of the meniscus tangent connecting the meniscus-crystal contact and the melt base unchanged. This leads to the expression $$\frac{\delta h}{h} = \tan(\Theta) \cdot \delta \Theta_S \quad (8.0)$$

After substitution of $$\frac{\delta h}{h},$$

equation 7.1 can be rearranged into an expression for $G_L$ by known and/or measured values $$G_L = \frac{L}{\kappa_L \cdot \tan(\Theta)} \cdot \frac{\delta v_g}{\delta \Theta_S} \quad (9.0)$$

and with this, $G_S$ can be obtained from equation 5.0. Thus, temperature gradients, which are important crystal growth conditions, can be measured by measuring the pull speed modulation-related response in crystal diameter change and/or meniscus height. That is, the modulation of the crystal pull speed by the time varying, periodic signal will cause a response in the form of a change in the crystal diameter. It will also cause a change in the meniscus height. Both of these values, the crystal diameter and the meniscus height, can be measured using conventional equipment such as the camera (FIG. 1). By monitoring these changes, the characteristic (characteristic for the entire growth front, not just at the crystal surface) values for the growth front thermal gradients in the melt and in the crystal can be calculated. This information can then be used to control relevant process parameters that affect intrinsic crystal properties, such as melt gap or target pull speed etc.

Figure 3:
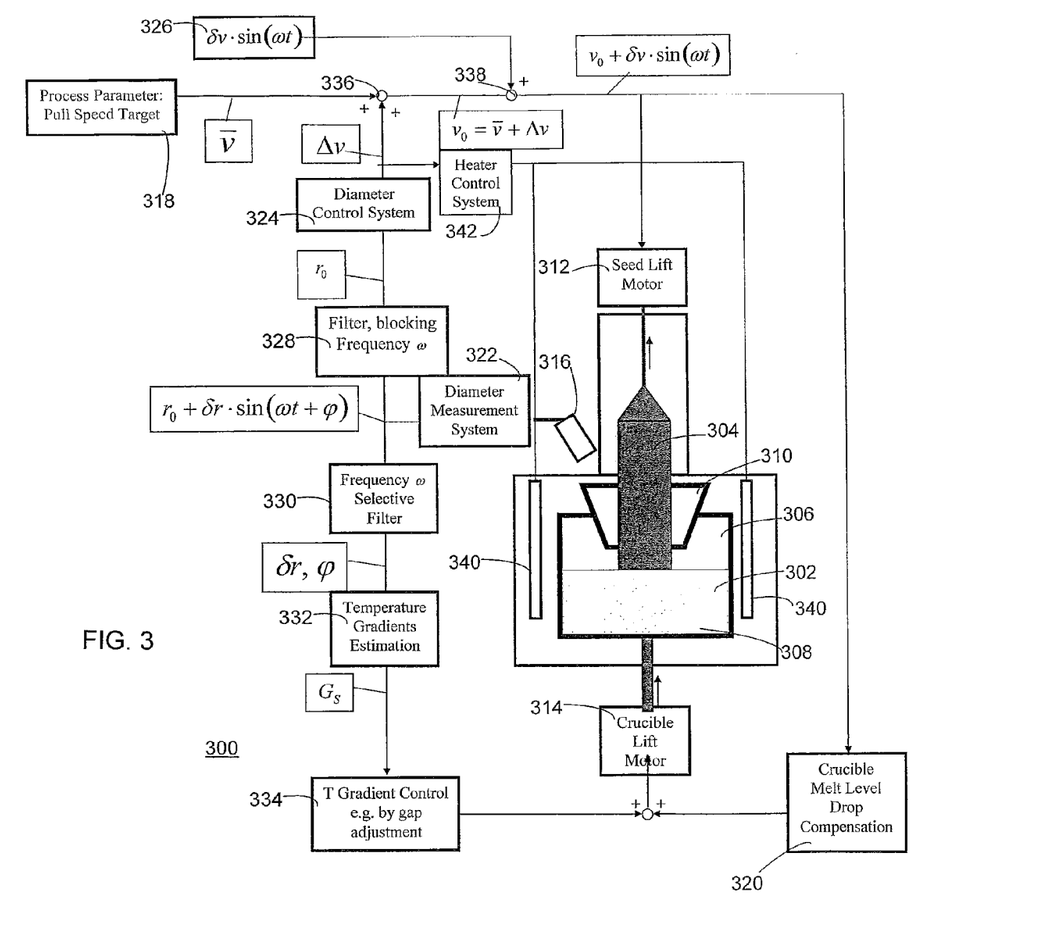
FIG. 3 is a flow diagram illustrating a method for manufacturing a semiconductor crystal.

FIG. 3 illustrates one embodiment of a crystal growth system 300. The system 300 includes a pull chamber 302 including a crystal 304 being pulled from a crucible 306. Melt 308 is contained in the crucible 306. The system 300 further includes a heat reflector cone 310, a seed lift motor 312 and a crucible lift motor 314. The system 300 further includes a crystal diameter measuring device 316 and an associated diameter measurement system 322.

The system 300 further includes several elements that form a control system. These elements include a target pull speed output 318, a crucible melt level drop compensation mechanism 320, a diameter control mechanism 324, and a device 326 for superimposing normal pull speed $v_0$ with a periodic signal of predetermined frequency $\omega$ and amplitude $\delta v$. The control system further includes a filter 328, a filter function 330, a temperature gradient estimation system 332 and a temperature gradient control system 334.

The control system may be formed in any suitable manner. In one embodiment, the control system includes a processor and memory. The memory stores data and instructions for controlling the processor. The processor, in response to the data and instructions, implements functions and systems such as the target pull speed output 318, the crucible melt level drop compensation mechanism 320, the diameter control mechanism 324, and the device 326. Further the processor uses the instructions and data and implements the filter 328, the filter function 330, the temperature gradient estimation system 332 and the temperature gradient control system 334. Any logical or signal processing functions described or suggested herein can be equivalently performed by either a programmed processor, other hardware or hardware and software in combination.

The target pull speed output 318 provides a nominal pull speed signal for the seed lift motor 312. In response to this signal, the motor 312 sets or varies the pull-up speed for lifting the crystal 304. The nominal pull speed signal $\bar{v}$ is provided to a combiner 336. The crucible melt level drop compensation mechanism 320 generates a signal for the crucible lift motor 314 to vary the position of the crucible 306. Generally, the motor 314 in response to the melt level drop compensation mechanism 320 generates a crucible lift to compensate for the dropping of the level of the melt 308 in the crucible 306 as the crystal 304 is formed and pulled from the crucible 306.

The diameter measuring device 316 measures the diameter of the crystal 304 and provides a measurement signal to the diameter measurement system 322 which determines the diameter of the crystal 304. The diameter measurement system 322 provides a diameter signal to the diameter control system 324. The diameter control system 324 in turn is coupled to the combiner 336 and provides a pull speed correction signal to the combiner 336.

The device 326 for superimposing the normal pull speed $v_0$ with a periodic signal of predetermined frequency $\omega$ and amplitude $\delta v$ produces a signal $\delta v \cdot \sin(\omega \cdot t)$ and provides this signal to a combiner 338. The output of the combiner is a speed control signal $v_0 + \delta v \cdot \sin(\omega \cdot t)$ which is provided to the seed lift motor 312. The seed lift motor 312 responds to this signal to set or vary the pull-up speed for the crystal 304.

The filter 328 is positioned between the diameter measurement system 316 and the diameter control system 324. The diameter measurement system 316 produces an output signal $r_0 + \delta r \cdot \sin(\omega t + \phi)$. The filter 328 blocks the frequency $\omega$. That is, the filter 328 forms a notch-filter in one embodiment. The output of this filter 328 provides the input for the diameter control system 324.

The filter 330 is positioned between the diameter measurement system 316 and the temperature gradient estimation system 332. In one embodiment, the filter 330 implements a frequency selective filter algorithm, such as a Fourier-analysis-based filter algorithm, extracting the amplitude $\delta r$ and time shift $\phi$ from the diameter signal $r_0 + \delta r \cdot \sin(\omega t + \phi)$.

The system 300 further includes a heater 340 and a heater control 342. In one embodiment, the heater control is a part of the control unit which controls operation of the system 300. The heater 340 operates in response to the heater control 342 to apply heat to the crucible to maintain the melt at a predetermined temperature. The heater control 342 has an input coupled to the output of the diameter control system 324 to detect the signal produced by the diameter control system. The heater control 342 thus forms a feed-back control that controls power in the heater 340 so that the average output from the diameter control system 324 is zero. In other words, the average pull-speed is equal to the nominal pull-speed.

The temperature gradient estimation system 332 implements an algorithm to estimate the temperature gradients $G_S$ and $G_L$ based on the values $\omega$, $\delta v$, $\delta r$ and $\phi$. The result is the temperature gradients $G_S$ and $G_L$. This output information is provided to the temperature gradient control system 334. In one embodiment, this system implements a temperature gradient control algorithm. The goal of the algorithm is correcting the crystal temperature gradients $G_S$ and $G_L$ by adjusting the gap between surface of the melt 308 and heat reflector cone 310 by adding a corrective term to the signal which controls the crucible lift motor 314. This is only an exemplary embodiment. Other applications are possible using the same pull-speed modulation technique.

As the crystal 304 is pulled out of the melt 308, the melt level in the crucible 306 drops. Simultaneously, the crucible 306 is being raised by the crucible lift motor 314 in order to compensate for the dropping crucible melt level. Compensation is done such that the melt position and the gap between the melt surface and the heat reflector cone 310 remains constant. Ideally, the thermal gradient $G_S$ in the crystal 304 remains constant as well.

The speed at which the crystal 304 is pulled out of the melt 308 is determined by the target pull speed $\bar{v}$ plus a corrective term $\Delta v$ coming from the diameter control system 324 plus a periodic term of amplitude $\delta v$ and frequency $\omega$, causing a small diameter modulation. The diameter measurement system 322 observes the diameter and produces a signal $r_0 + \delta r \cdot \sin(\omega t + \phi)$ that contains a small modulation.

The small diameter modulation information $\delta r$ and $\phi$ that is contained in the diameter signal is extracted by a frequency selective algorithm in filter 330. Based on that and the predetermined value $\delta v$ the approximate temperature gradients $G_S$ and $G_L$ in melt and crystal are calculated. The results of this filtering operation are then used to compare these values to target values and make adjustments to relevant system parameters in order to compensate for deviations from target.

During all this, the diameter control system 324 is not affected by the small diameter modulation, because it receives its input via the filter 328 that blocks out frequency ω.

There is no heretofore known method for in-situ growth front temperature gradient estimation that is characteristic for the entire growth front and not just near the crystal surface. However, such information is very much desired for a number of CZ products, because it determines intrinsic crystal properties such as defect distribution etc.

In conventional systems, intrinsic crystal properties are analyzed after the crystal has grown and based on such information corrections to process parameters affecting the temperature gradients are made. Because of the complicated and time-consuming analysis involved, such adjustments are available not before the next batch, but often even later.

Such batch to batch adjustments of certain process parameters are necessary for compensating aging effects on certain hot zone material. For instance, heat reflectivity of the heat reflector shield of the hot zone changes over time. Being a vital part of the hot-zone design, the heat reflector is designed to achieve certain temperature gradients in the crystal and the melt. As its relevant material properties change, the temperature gradients in the crystal and melt change too, which can be compensated e.g. by adjusting the gap between the melt and the heat reflector shield.

In addition to the gradual changes there are also unpredictable factors that can cause deviations of the actual gradients from the targeted gradients. Mostly these have to do with tolerances and human errors when the hot zone is made ready for a batch process. In conventional systems, these cannot be compensated at all, because there is no known method that can provide the necessary information already during crystal growth.

The presently disclosed method and apparatus provide for in-situ determination of temperature gradients in melt and crystal that are characteristic for the entire growth front. The results of this method and apparatus can be used to detect deviations from the desired conditions and to make adjustments during crystal growth, for example by changing the gap between melt surface and heat reflector by adjusting the crucible lift motor 314.

From the foregoing, it can be seen that the present invention allows calculation of Temperature Gradient values at the crystal growth front (crystal-melt interface) substantially in real time. Temperature gradients are important crystal growing process parameters that affect crystal diameter control, crystal morphological stability in heavily doped crystal growing, and intrinsic material properties like bulk crystal microdefects. The disclosed embodiments provide a way for in-situ observation and calculation of characteristic or average values for the temperature gradients $G_S$ and $G_L$. The obtained values are characteristic for the entire growth front. The embodiments require no additional hardware, but only use already existing controls and detectors.

Moreover, these embodiments make it easier to identify problematic growth conditions and help to improve the performance of crystal growing programs. Based on the disclosed technique, the growing control software operating in the control unit can actively steer the system away from undesirable growth conditions, to prevent dislocation nucleation, morphological instability, undesirable micro-defects, or other kinds of prime yield loss.

It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor crystal growth apparatus comprising:
   a crucible to hold melt;
   a crystal pull unit configured to pull a crystal from the crucible at a pull speed;
   a control unit including a memory to store data and instructions and a processing unit configured in response to the stored data and instructions to determine the pull speed and to produce control signals for the crystal pull unit, the control unit coupled with the crystal pull unit and configured to control the pull speed by applying the control signals to the crystal pull unit so that the pull speed is modulated about an average pull speed, by superimposing a periodic pull speed on the average pull speed, according to $v = v_o + \delta v \cdot \sin(\omega \cdot t)$ where v is the pull speed, $v_o$ is the normal pull speed, δv is the amplitude, and ω is the angular frequency of modulation of the pull speed, and
   a temperature gradient estimation system configured to estimate thermal gradients in the crystal and the melt based in part on a response to the superimposed periodic pull speed.

2. The semiconductor crystal growth apparatus of claim 1 further comprising:
   a crystal diameter sensor coupled with the control unit and configured to measure diameter of the crystal including detecting response to modulation of the pull speed as a change in diameter of the crystal.

3. The semiconductor crystal growth apparatus of claim 2 wherein the control unit is configured to determine thermal gradients for a crystal growth front in the melt and in the crystal based on the change in diameter of the crystal.

4. The semiconductor crystal growth apparatus of claim 3 wherein the control unit is further configured to adjust the pull speed based on the determined thermal gradients.

5. The semiconductor crystal growth apparatus of claim 1 further comprising:
   one or more sensors in data communication with the control unit to detect a pull speed modulation response and provide data indicative of the pull speed modulation response to the control unit.

6. The semiconductor crystal growth apparatus of claim 5 further comprising:
   an application stored in the memory and including instructions responsive to the data indicative of the pull speed modulation response to determine corrections to relevant system parameter such as target pull-speed or melt gap.

7. A semiconductor crystal growth apparatus comprising:
   a crucible to hold melt;
   a crystal pull unit configured to pull a crystal from the crucible at a pull speed;
   a diameter measurement system configured to provide a diameter signal indicative of diameter of the crystal;
   a control system configured to control the crystal pull unit, the control system including a memory to store data and instructions; and
   a processor responsive to the stored data and instructions, the processor configured to provide to the crystal pull unit a nominal pull speed signal superimposed with a periodic pull speed signal of predetermined frequency according to $v = v_o + \delta v \cdot \sin(\omega \cdot t)$ where v is the pull speed, $v_o$ is the normal pull speed, δv is the amplitude, and ω is the angular frequency of modulation of the pull speed, the processor further configured to estimate temperature gradients in the crystal and the melt based in part on response to the superimposed periodic pull speed signal.

8. The semiconductor crystal growth apparatus of claim 7 further comprising:
a crucible lift motor responsive to control signals from the processor to adjust position of the crucible;
wherein the processor implements a temperature gradient control system to produce the control signals to adjust position of the crucible, the control signals including a nominal crucible lift signal and a corrective signal to adjust temperature gradients in the melt and the crystal based on the estimated temperature gradients.

9. The semiconductor crystal growth apparatus of claim 8 further comprising:
a heat reflector cone positioned near an interface between the melt and the crystal, and wherein the temperature gradient control system produces the nominal crucible lift signal and the corrective signal so that a gap between a surface of the melt and the heat reflector cone remains substantially constant.

10. The semiconductor crystal growth apparatus of claim 8 further comprising:
a heat reflector cone positioned near an interface between the melt and the crystal, and wherein the temperature gradient control system produces the nominal crucible lift signal and the corrective signal so that a thermal gradient in the crystal remains substantially constant.

11. The semiconductor crystal growth apparatus of claim 7 wherein the diameter measurement system is operative to provide the diameter signal including a periodic component based on the periodic pull speed signal of predetermined frequency and wherein the processor is operative to implement a frequency blocking filter to filter the predetermined frequency of the periodic signal of predetermined frequency from the diameter signal to produce a diameter control input signal and wherein the processor is further operative to provide a pull speed correction signal based on the diameter control input signal, the crystal pull unit being responsive to the pull speed correction signal to adjust the pull speed.

12. The semiconductor growth apparatus of claim 11 wherein the processor implements a frequency selective filter to estimate a signal amplitude and a time shift based on the diameter signal and wherein the processor further implements a temperature gradient estimation system configured to estimate the temperature gradients based on the predetermined frequency and an amplitude of the periodic signal of predetermined frequency and the estimated signal amplitude and time shift.

13. A semiconductor crystal growth apparatus comprising:
a crucible to hold melt;
a crystal pull unit configured to pull a crystal from the crucible at a pull speed;
a diameter control system configured to generate control signals for the crystal pull unit to cause the crystal pull unit to modulate the pull speed at which the crystal is pulled from the crystal by superimposing a periodic pull speed on an average speed, the average speed including a target pull speed plus a corrective speed, according to $$v = v_o + \delta v \cdot \sin(\omega \cdot t)$$

where v is the pull speed, $v_o$ is the normal pull speed, $\delta v$ is the amplitude, and $\omega$ is the angular frequency of modulation of the pull speed; and
a temperature gradient estimation system configured to estimate temperature gradients in the semiconductor crystal and the melt based in part on response to the superimposed periodic pull speed.

14. The semiconductor crystal growth apparatus of claim 13 further comprising:
a diameter measurement system operative to detect a response to modulation of the periodic pull speed as a modulation in diameter of the crystal.

15. The semiconductor crystal growth apparatus of claim 14 wherein the temperature gradient estimation system is responsive to a diameter signal produced by the diameter measurement system to determine thermal gradients for a crystal growth front in the melt and in the crystal based on the change in the diameter of the crystal.

16. The semiconductor crystal growth apparatus of claim 15 further comprising:
a temperature gradient control system operative in response to the temperature gradient estimation system to adjust relevant process parameters including at least one of the target pull speed or melt gap based on the determined thermal gradients.

17. The semiconductor crystal growth apparatus of claim 13 further comprising:
a diameter measurement system operative to detect a change in meniscus height in the melt and a response to modulation of the periodic pull speed.

18. The semiconductor crystal growth apparatus of claim 17 wherein the temperature gradient estimation system is responsive to the change in meniscus height to determine thermal gradients for a crystal growth front in the melt and in the crystal.

19. The semiconductor crystal growth apparatus of claim 18 further comprising:
a temperature gradient control system operative in response to the temperature gradient estimation system to adjust relevant process parameters including at least one of the target pull speed or melt gap based on the determined thermal gradients for the crystal growth front.

* * * * *